(12) United States Patent
Ibanez et al.

(10) Patent No.: US 9,006,767 B2
(45) Date of Patent: Apr. 14, 2015

(54) LUMINOPHORE COMPOSITION FOR UV-VISIBLE LIGHT CONVERSION AND LIGHT CONVERTER OBTAINED THEREFROM

(75) Inventors: Alain Ibanez, Voiron (FR); Vinicius Ferraz Guimaraes, St Martin Le Vinoux (FR); Lauro June Queiroz Mala, Goiania (BR); Antonio Carles Hernandes, Sao Carlos (BR)

(73) Assignee: Centre National de la Recherche Scientifique—CNRS, Paris (FR)

( * ) Notice: Subject to any disclaimer, the term of this patent is extended or adjusted under 35 U.S.C. 154(b) by 75 days.

(21) Appl. No.: 13/996,775

(22) PCT Filed: Dec. 23, 2011

(86) PCT No.: PCT/EP2011/074032
§ 371 (c)(1),
(2), (4) Date: Oct. 14, 2013

(87) PCT Pub. No.: WO2012/085290
PCT Pub. Date: Jun. 28, 2012

(65) Prior Publication Data
US 2014/0042477 A1    Feb. 13, 2014

(30) Foreign Application Priority Data
Dec. 23, 2010    (EP) ..................................... 10290678

(51) Int. Cl.
*H01L 33/00*    (2010.01)
*C09K 11/77*    (2006.01)
*C03B 19/10*    (2006.01)
*C03C 4/12*    (2006.01)
*C03C 12/00*    (2006.01)
*H01L 33/50*    (2010.01)

(52) U.S. Cl.
CPC ......... *C09K 11/7712* (2013.01); *C03B 19/1065* (2013.01); *C03C 4/12* (2013.01); *C03C 12/00* (2013.01); *H01L 33/502* (2013.01)

(58) Field of Classification Search
CPC .................... H01L 27/3267; H01L 31/02322; H01L 31/12
USPC ......................... 257/98, 99; 422/82.07, 82.08
See application file for complete search history.

(56) References Cited

U.S. PATENT DOCUMENTS

| | | | |
|---|---|---|---|
| 5,942,189 A * | 8/1999 | Wolfbeis et al. | 422/82.08 |
| 2002/0048543 A1* | 4/2002 | Huguenin et al. | 423/277 |
| 2011/0038947 A1* | 2/2011 | Maurer et al. | 424/600 |

* cited by examiner

*Primary Examiner* — Brook Kebede
(74) *Attorney, Agent, or Firm* — Osha Liang LLP (57) ABSTRACT

A luminophore composition comprising amorphous aluminoborate powders is disclosed. The composition is obtainable by preparing an aluminoborate resin by a wet chemical route based on precursors solutions substantially free from monovalent and divalent cations; drying the resin to obtain a solid; grinding the solid to obtain a powder; pyrolyzing the powder at a pyrolysis temperature lower than the crystallization temperature of the composition; and calcinating the powder so pyrolyzed at a calcination temperature lower than the crystallization temperature of the composition. Furthermore, a process for the preparation of said composition is disclosed. The composition is particularly suitable for use in solid-state lighting, and for example for converting UV light into warm white visible light.

20 Claims, 6 Drawing Sheets

LUMINOPHORE COMPOSITION FOR UV-VISIBLE LIGHT CONVERSION AND LIGHT CONVERTER OBTAINED THEREFROM

TECHNICAL FIELD

The present disclosure relates to a luminophore composition, particularly but not exclusively suitable for UV-visible light conversion, for example for converting UV light into white visible light, for example into warm white light. The luminophore composition of the present disclosure may be for example used to convert the UV light emitted by light-emitting diodes (LEDs). The present disclosure also relates to a process for the preparation of said composition, and to the use of said composition to prepare solid-state light converters. Furthermore, the present disclosure relates to a solid-state lighting device comprising such a converter.

In present description and in the following claims, the expression "warm white light" is intended to indicate a light having a predetermined color temperature, for example comprised between 4000 K and 5000 K, corresponding to a natural white light and arising from a broad luminescence band lying in the entire visible region, i.e. from about 400 nm to about 700 nm.

BACKGROUND ART

As known, light emitters such as for example LEDs are semiconductor light sources with a narrow band emission that can be manufactured to emit in the ultraviolet (UV), visible or infrared regions of the spectrum.

LEDs are used as indicator lamps in many devices, and are increasingly used for lighting. Among LEDs, white LEDs represent a promising, high-efficiency technology for illumination.

To generate white light for general illumination applications, the narrow spectral band of a LED's emission must be converted into white light, or two or more discrete emissions must be mixed.

The conversion of the light emitted by LEDs into white light is performed by phosphor-based LEDs, which are obtained by coating a LED, generally a blue or UV LED, with a phosphor material of different colors selected depending on the color of the original LED, to convert the monochromatic light from the blue or UV LED to an apparent white light, which however does not exhibit a broad band in the visible region.

Mixing different discrete emissions is performed by multi-colored white LEDs, which are obtained by combining individual LEDs emitting different primary colors, generally red, green, and blue.

LEDs are also known which generate white light using a combination of phosphor conversion and color-mixing.

However, on the one side, it is difficult to maintain consistent-quality white light due to natural variations in LED wavelength or in the phosphor material used in phosphor based LEDs.

In addition, prior art white LEDs developed so far exhibit a sharp blue emission leading generally to cool lighting, which in the art is referred to as "blue-light hazard" since it is uncomfortable and hazardous to eyes. Blue light, in fact, due to glare and dazzle effects, may cause eyestrain, retinal injury and fatigue and may disrupt sleep patterns.

Furthermore, the typically available highly emissive phosphors include expensive and environmentally toxic metals, such as silver, cadmium, germanium or rare-earth elements.

In this regard, there have been attempts to provide more stable and efficient and less toxic photoluminescent materials, as described in Hayakawa et al., "White light emission from radical carbonylterminations in aluminosilicate ($Al_2O_3$—$SiO_2$) porous glasses with high luminescence quantum efficiencies", Applied Physics Letters, Vol. 82, No. 18, May 5, 2003. However, the sol-gel derived glasses of aluminosilicate compositions described therein are excited at an excitation length which is too far from the visible region.

On the other side, the mechanism involved in the electro-optical devices used to control the blending and diffusion of the different colors in multi-colored white LEDs renders this type of white LEDS of limited use.

SUMMARY OF THE DISCLOSURE

An object of the present disclosure is to provide a luminophore composition, particularly but not exclusively suitable for conversion of UV light emitted by UV light emitters into white visible light, which is capable of emitting a broad-spectrum white light spread out on all the visible region, i.e. from about 400 nm to about 700 nm, without blending different colors and without requiring use of several phosphors and/or toxic materials.

A further object of the present disclosure is to provide warm white lighting avoiding the above-mentioned blue-light hazard.

A further object of the present disclosure is to provide a composition for use in solid-state lighting devices, which are both efficient and environmentally friendly.

The above-mentioned objects, as well as further advantages, are achieved by a luminophore composition comprising amorphous aluminoborate powders, the composition being obtainable by a process comprising:

preparing an aluminoborate resin by a wet chemical route based on precursors solutions substantially free from monovalent and divalent cations;

drying the resin to obtain a solid;

grinding the solid to obtain a powder;

pyrolyzing the powder at a pyrolysis temperature lower than the crystallization temperature of the composition; and calcinating the powder so pyrolyzed at a calcination temperature lower than the crystallization temperature of the composition.

In the present description and in the following claims, the terms "amorphous powders" are intended to comprise both amorphous powders in general and glassy powders having a glassy transition temperature.

In one embodiment, the composition is obtained by carrying out a process comprising the above-mentioned steps.

Advantageously, the composition is capable to convert UV light into visible white light at all wavelengths of the visible region, thus permitting to provide lighting which is comfortable for eyes and has no undesired photo-biological effects on human health.

Advantageously, luminescence quantum yields from 0.4 to 0.7 at a wavelength of about 385 nm may be obtained. For example, luminescence quantum yields may range from 0.7 to 0.9, for example from 0.8 to 0.9, at a wavelength of about 365 nm.

Depending on the composition of the aluminoborate, the luminescence emission band of the composition may range from 350 nm to 800 nm. In one embodiment, the luminescence emission band of the composition may range from 350 nm to 750 nm, for example from 370 nm to 800 nm, for example from 390 nm to 750 nm, and for example from 400 nm to 700 nm.

Without being bound to a particular theory, the Applicants deem that the combination of process steps by which the composition is obtainable results in defects in the structure of amorphous aluminoborates powders. The structural defects may for example comprise non-bridging oxygen atoms or related oxygen defects, as described in A. Colder et al. in Nanotechnology 15 (3), L1-L4 (2004), and/or interstitial carbon associated defects.

These structural defects lead to a high variety of luminescence emitters acting as colored centers giving rise to a broad emission in the whole visible region.

The wet chemical route, as known to the man skilled in the art, is a chemistry synthesis based on the preparation of homogeneous solutions by dissolving all precursors in solution and, according to one embodiment, in aqueous solution. The dissolution is favored by complexing the metal ions. Then, by reaction of polymerization, a homogenous resin or gel is obtained.

Advantageously, the use of a wet chemical route results in a high atomic homogeneity of constituent components in the liquid precursor, which facilitates the synthesis of high purity powders with nanometer or micron-sized particles.

The wet chemical route can be for example a polymeric precursor method (modified Pechini) or sol-gel chemistry, as well as their combination, but also precipitation, emulsion and spray-based syntheses are possible. In one embodiment, the wet chemical route is a polymeric precursor method.

Independently of the type of wet chemical route, the solutions containing the precursors are substantially free from monovalent and divalent cations.

In the present description and in the following claims, a solution substantially free from monovalent and divalent cations is intended to indicate a solution comprising less than 5000 ppm of monovalent and divalent cations, such as for example $Na^+$, $K^+$, $Ca^{2+}$, $Mg^{2+}$. The solution may contain less than 2000 ppm of monovalent and divalent cations, for example less than 1000 ppm of monovalent and divalent cations, for example less than 500 ppm of monovalent and divalent cations. The solution may contain less than 300 ppm, for example less than 100 ppm, for example less than 50 ppm, for example less than 10 ppm, for example less than 5 ppm of monovalent and divalent cations.

According to one embodiment, the precursors solutions are free from monovalent and divalent cations.

Without being bound to a particular theory, it is deemed that monovalent and divalent cations cause the formation of structural defects such as oxygen vacancies or other defects constituting fluorescence quenching sources.

In one embodiment, the above-mentioned aluminoborate has the following composition:

$xM_2O_3+yAl_2O_3+zB_2O_3$ wherein
M is at least one trivalent metal,
$0 \leq x \leq 0.25$,
$0.1 \leq y \leq 0.7$,
$0.3 \leq z \leq 0.9$, and
$x+y+z=1$.

M may be selected from the group comprising Y, Bi, Sc or any lanthanide, or from mixtures thereof.

In one embodiment, the composition comprises two trivalent metals M.

In one embodiment, the trivalent metal is selected from the group comprising $Y^{3+}$, $Bi^{3+}$, $Sc^{3+}$, $La^{3+}$, $Gd^{3+}$, or from mixtures thereof.

In one embodiment, M is $Y^{3+}$.

According to one embodiment, $0 \leq x \leq 0.20$. In one embodiment, $0 \leq x \leq 0.150$.

According to one embodiment, $x \geq 0.1$.

According to one embodiment, $0.1 \leq y \leq 0.4$. In one embodiment, $0.3 \leq y \leq 0.4$.

According to one embodiment, $0.1 \leq z \leq 0.7$. In one embodiment, $0.4 \leq z \leq 0.6$.

According to one embodiment, $B_2O_3$ can be partially replaced by $SiO_2$ or $P_2O_5$ or by any other glass former.

According to one embodiment, the molar ratios of each of $SiO_2/B_2O_3$ and $P_2O_5/B_2O_3$ can be comprised from 0 to 4, for example from 0 to 3, for example from 0 to 2, or example from 0 to 1, for example from 0 to 0.5, and for example from 0 to 0.3.

According to a further embodiment, the molar ratios of each of $SiO_2/B_2O_3$ and $P_2O_5/B_2O_3$ can be comprised from 0.1 to 1, for example from 0.1 to 0.5, for example from 0.1 to 0.3.

According to one embodiment, the aluminoborate composition comprises $YAl_3(BO_3)_4$ or a composition which is around the stoichiometric composition of $YAl_3(BO_3)_4$.

In the present description and in the following claims, a composition around the stoichiometric composition indicates a composition in which each element may independently deviate from the respective stoichiometric value up to 10% mol, and for example up to 5% mol.

For lighting applications, the above-mentioned powders may have a mean particle diameter ranging for example from 0.01 μm to 20 μm, for example from 0.01 ηm to 7 μm, for example from 0.02 μm to 7 μm, for example from 0.05 μm to 3 μm, and for example from 0.7 μm to 2 μm.

However, for lighting applications comprising a nanostructured semiconducting structure, the powders may have for example a nanometric size, for example a mean particle diameter from 20 nm to 200 nm, for example from 20 nm to 80 nm, and for example from 30 nm to 50 nm.

In this way, the powders can be incorporated in nanostructured chips as emitting semiconductors of LEDs.

The size of the powders can be suitably controlled by selecting a predetermined initial size of the dried resin. Furthermore, by envisaging shaping treatments of the resin such as spray drying, spray pyrolysis or supercritical fluid drying, diameters in the range of about 20-40 nm can be achieved.

All values of mean particle diameter refer to a mean particle diameter measured according to standard electron microscopy or light scattering measurements.

The above-mentioned amorphous powders may have a glassy nature. In this case, the glass transition temperature $T_g$ may be of at least from 450° C. (for example in the case of alumino-borophosphate powders), up to about 1000° C. (for example in the case of alumino-borosilicate powders).

The $T_g$ is determined by standard differential scanning calorimetry or differential thermal analysis.

According to a second aspect thereof, the present disclosure relates to a process for the preparation of a composition as described above, the process comprising:
preparing an aluminoborate resin by means of a wet chemical route based on precursors solutions substantially free from monovalent and divalent cations;
drying the resin to obtain a solid;
grinding the solid to obtain a powder;
pyrolyzing the powder at a pyrolysis temperature lower than the crystallization temperature of the composition; and calcinating the powder so pyrolyzed at a calcination temperature lower than the crystallization temperature of the composition.

In one embodiment, the precursors comprise at least one trivalent metal, such as for example $Y^{3+}$, $Bi^{3+}$, $Sc^{3+}$, $La^{3+}$, $Gd^{3+}$, and Al and B corresponding salts (for example nitrates) and are provided in respective predetermined amounts corresponding to desired final composition.

When the polymeric precursor method is used to prepare the resin, a polyesterification reaction may be carried out. The polyesterification reaction may be carried out in solvents, and for example in aqueous solutions. The solutions are substantially free from monovalent and divalent cations.

In case the polymeric precursor route is used, polyesterification reactions between an alcohol and a carboxylic acid may be carried out. The polyesterification reactions lead to a resin in which the metal ions are trapped and dispersed at the molecular level in an organic network.

In one embodiment, the alcohol is a polyalcohol, such as for example sorbitol and ethylene glycol.

In one embodiment, the carboxylic acid is selected from the group comprising: acetic acid, citric acid, propionic acid and malic acid.

In one embodiment, the polyesterification reactions are carried out under reflux and solution stirring, for example at a temperature comprised between 80° C. and 150° C., for example between 100° C. and 130° C., for example at about 110° C. In one embodiment, the polyesterification reactions are performed for at least 12 h, for example for about 24 h.

In one embodiment, the excess of solvent is removed from the resin before drying the resin, for example by solvent evaporation. In one embodiment, the viscosity of the resin is increased before drying of the resin. In one embodiment, the viscosity of the resin is increased in a gradual manner, for example by solvent evaporation. If aqueous solutions are used, evaporation refers to evaporation of water. In this case, the evaporation may be performed at a temperature between 50° C. and 95° C., for example between 80° C. and 90° C., for example at about 90° C.

In one embodiment, the drying of the resin is performed at a temperature from 200° C. to 350° C., for example from 230° C. to 300° C., for example from 240° C. to 260° C., for example at about 250° C.

In one embodiment, drying is performed under air atmosphere. However, drying can be also performed under an inert atmosphere, for example under nitrogen or argon.

In one embodiment, drying is performed for a time comprised between 10 minutes and 60 minutes, for example between 20 minutes and 40 minutes, and for example for about 30 minutes.

In one embodiment, drying is performed at a predetermined heating rate, which may be for example comprised between 10° C./h and 60° C./h, for example between 20° C./h and 40° C./h, for example at about 30° C./h.

Subsequently, the resin so dried becomes a solid that is subjected to grinding to obtain an amorphous powder. The grinding can be done with any standard manual or automatic crusher, such as for example an agate crusher, a ball milling, a planetary automatic crusher.

In one embodiment, after grinding the amorphous powders have a mean particle diameter ranging from 0.2 µm to 20 µm, for example from 0.2 µm to 10 µm, for example from 0.5 µm to 7 µm, and for example from 1 µm to 5 µm.

The amorphous powder is then pyrolyzed.

In the present description and in the following claims, the term "pyrolysis" is used to indicate the decomposition of a material or compound due to heat in the absence of oxygen or any other reagents.

Thanks to pyrolysis, a controlled partial oxidation of the powders is made. In one embodiment, the controlled partial oxidation involves oxygen only deriving from the starting materials, such as for example the oxygen coming from hydroxides, alcohols, carboxylic groups and boric groups.

The amorphous powder is pyrolyzed at a pyrolysis temperature, which is lower than the crystallization temperature of the composition.

In one embodiment, pyrolysis is performed at a predetermined temperature, which is chosen depending on the chemical composition. In one embodiment, the predetermined pyrolysis temperature is from to 450° C. to 1000° C., for example from 600° C. to 800° C., and for example from 600° C. to 750° C., and for example from 690° C. to 730° C., for example at about 700° C., but in any case at a temperature lower than the crystallization temperature of the composition.

In one embodiment, pyrolysis is performed under inert atmosphere, such as for example under nitrogen or argon atmosphere.

In one embodiment, pyrolysis is performed for a predetermined time, for example for at least 6 h, for example from 20 h to 30 h, for example from 22 h to 26 h, and for example of about 24 h.

According to one embodiment, pyrolysis is performed at a predetermined heating rate. In one embodiment, the heating rate is comprised from 10° C./h to 60° C./h, for example from 20° C./h to 40° C./h, for example at about 30° C./h.

Subsequently, the amorphous powder so pyrolyzed is calcinated at a temperature lower than the crystallization temperature of the composition.

In the present description and in the following claims, the term "calcination" is used to indicate the decomposition or reaction of oxidation of a material due to heat in the presence of oxygen.

According to one embodiment, the calcination can be performed by gradually increasing the temperature until a final calcination temperature, for example by increasing the temperature at a predetermined heating rate.

In one embodiment, the calcination is performed at a heating rate ranging from 10° C./h to 60° C./h, for example between 20° C./h and 40° C./h, for example at about 30° C./h.

Depending on the powder composition, the calcination may be performed at a final predetermined calcination temperature, for example ranging from to 450° C. to 850° C., for example from 500° C. to 800° C., for example from 600° C. to 770° C., for example from 650° C. to 750° C., for example from 720° C. to 740° C., and for example at about 740° C., but in any case at a temperature which is lower than the crystallization temperature of the composition.

The calcination can also be performed by holding a predetermined intermediate temperature lower than the final calcination temperature for a predetermined time, for example for several hours, for example for 6-36 h, and for example for 24 h. In one embodiment, the intermediate temperature ranges from 300° C. to 550° C.

The heating during the calcination can be made by holding a predetermined intermediate temperature for a predetermined time or, for example, by holding a predetermined intermediate temperature each time a predetermined temperature increase is attained, such as for example at every increase of 50° C.-100° C.

In one embodiment, the calcination is performed under oxygen atmosphere. However, other calcination atmospheres are possible, such for example air.

In one embodiment, the calcination under oxygen atmosphere is performed for a time comprised from 12 h to 36 h, for example from 22 h to 26 h, for example for about 24 h.

In one embodiment, the calcination under air atmosphere is performed for a time, which is about twice the time of a corresponding calcination performed under oxygen.

According to a further aspect thereof, the present disclosure relates to the use of a composition comprising amorphous powders of aluminoborate as defined above to prepare a solid-state light converter, for example an UV-visible light converter.

In one embodiment, the visible light is a white light having a predetermined color temperature, for example from 4000 K to 5000 K.

However, according to other embodiments, by suitably varying the above-mentioned composition, with the composition of the present disclosure it is also possible to obtain a color temperature up to 10000 K.

According to a further aspect thereof, the present disclosure relates to a solid-state lighting device comprising an emitter, for example an UV emitter, and a converter as defined above.

In one embodiment, the light emitted is a white light having a predetermined color temperature, for example of 4000 K to 5000K, i.e. a warm natural white lighting which is comfortable to eyes and save lighting.

In one embodiment, the emitter is an emitting diode (LED), for example an UV LED.

However, other emitters can be also used, such as for example emitters using UV emitting gases, for example rare gases such as Kr, Xe and Ne, which can be used either in lamps or in excimer laser.

Accordingly, depending on the composition of the amorphous powders, embodiments of lighting devices of the present disclosure may have a predetermined luminescence emission band, for example ranging from 350 nm to 750 nm, for example from 370 nm to 730 nm, for example from 390 nm to 700 nm, and for example from 400 nm to 700 nm.

Advantageously, in these ranges of luminescence emission band the heat load coming from near IR wavelengths on the LEDs device is avoided, which in turn increases the life-time of the lighting device.

DETAILED DESCRIPTION OF EMBODIMENTS OF THE PRESENT DISCLOSURE

Example 1

In the following, an example of luminophore composition comprising yttrium aluminoborate powders and an example of process for the preparation of such composition are described with reference to the schematic flow diagram of FIG. 1.

Figure 1:
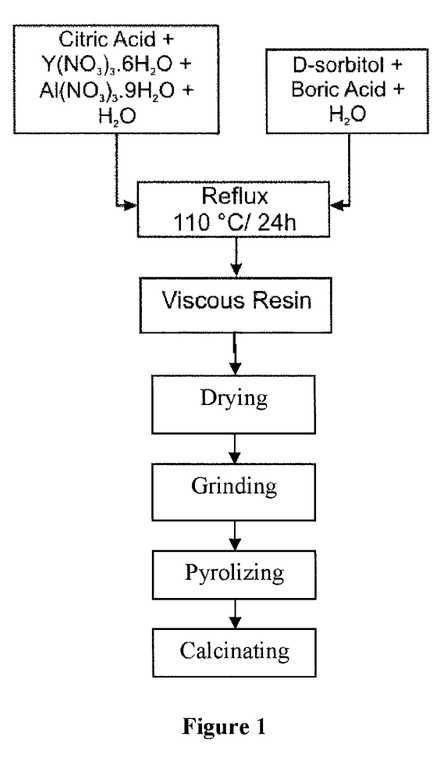
FIG. 1 is a schematic flow diagram showing an embodiment of a process for the preparation of a luminophore composition for UV-visible light conversion.

According to the embodiment of FIG. 1, the composition comprises amorphous powders around the stoichiometric composition of $YAl_3B_4O_{12}$ (YAB). If not otherwise indicated, the term YAB refers to the composition $YAl_3B_4O_{12}$ or around the stoichiometric composition thereof throughout the description and figures. Accordingly, an example of preparation of a ternary system $0.125\ Y_2O_3 + 0.375\ Al_2O_3 + 0.5\ B_2O_3$ is provided. To prepare 4 grams (0.01 mol) of a $YAl_3B_4O_{12}$ powder, two starting solutions were prepared, a first and second solution.

First Solution 46.11 g (0.24 mol) of citric acid ($C_6H_8O_7$, 99.5%, commercially available from Sigma Aldrich) were dissolved in 75 ml of pure water at 80° C. After the complete dissolution of citric acid, 3.80 g (0.01 mol) of yttrium nitrate hexahydrated ($Y(NO_3)_3 \cdot 6H_2O$, 99.99%, commercially available from Strem Chemicals) and 11.25 g (0.03 mol) of aluminum nitrate nonahydrated ($Al(NO_3)_3 \cdot 9H_2O$, 99.5%, commercially available from Fischer scientific) were added and kept under stirring for 30 minutes at 80° C.

Second Solution 30.74 g (0.169 mol) of D-sorbitol ($C_6H_{14}O_6$, 99.5%, commercially available from Sigma Aldrich) were dissolved in 75 ml of pure water at 80° C. The water contained less than 5 ppm of monovalent and divalent cations and had a conductivity of about 1.1 μS/cm.

Then, 2.47 g (0.04 mol) boric acid ($H_3BO_3$, 99.8%, commercially available from Fischer scientific) were added and kept under stirring for 30 minutes.

Subsequently, the first and the second solutions were mixed and placed under reflux and stirring at 110° C. for 24 hours, to perform the polyesterification reactions between the metallic citrates and boron complexes, leading to the formation of a polymeric resin. The water excess was removed by evaporation at 90° C. for several hours, until the initial volume reduced to half and a yellowish viscous resin was obtained.

The resin so obtained was dried at about 250° C. under air atmosphere at a heating rate of 30° C./h, for 30 minutes. Soft brown solids were obtained, which were easily crushed by means of an agate mortar to produce a fine and homogeneous brown amorphous powder.

The brown amorphous powder was then subjected to pyrolysis at 700° C. for 24 hours, under nitrogen atmosphere, at a heating rate of 30° C./h. This pyrolysis allowed a controlled partial oxidation of the precursors, resulting on a black amorphous powder.

Subsequently, the black amorphous powder was calcinated at 740° C. under oxygen atmosphere during 24 hours, at a heating rate of 30° C./h to obtain a final white amorphous powder having particle diameters ranging between 0.5 μm and 6 μm.

The white amorphous powder was deposited on common UV emitting diodes for UV-visible light conversion.

A broad luminescence band in the range from 380 nm to 750 nm was obtained. The white light was a warm white light having a color temperature of 4000-5000 K. The luminescence quantum yield at 385 nm was of about 0.7.

Although the above-mentioned embodiments have been described in detail, it is understood that other embodiments can be envisaged.

Thus, for example, any wet chemical technique known to the man skilled in the art can be used to synthesize the precursors, and different aluminoborate compositions can be envisaged to obtain the luminophore composition of the present disclosure.

In any case, according to the present disclosure, white visible light can be obtained by converting UV light without the need of blending different phosphors emitting different colors and without requiring use of toxic materials.

The process for the preparation of such composition is easy, efficient and environmentally friendly.

Analytical Properties

Figure 2:
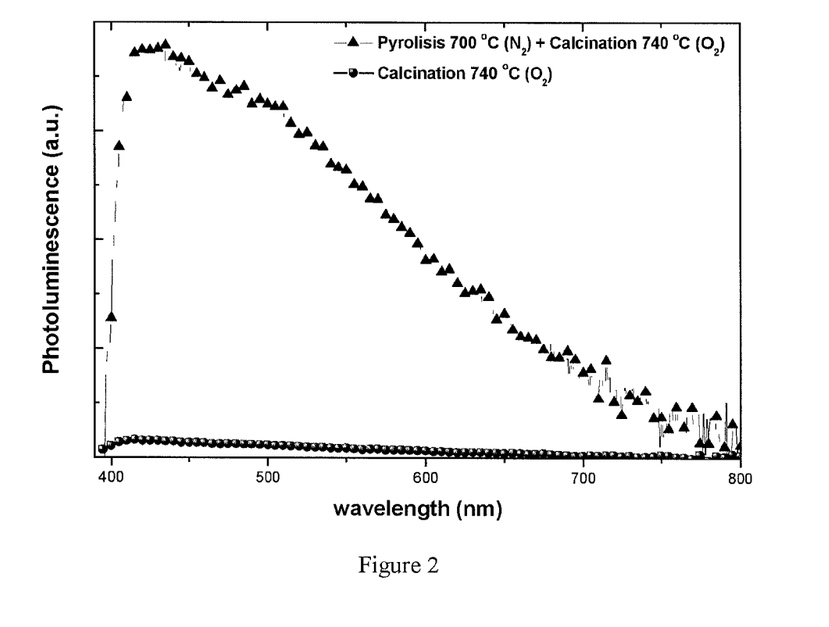
FIG. 2 shows the photoluminescence spectrum of a composition according to one embodiment of the present disclosure compared to the photoluminescence spectrum of a composition obtained without performing any pyrolysis.
Figure 9:
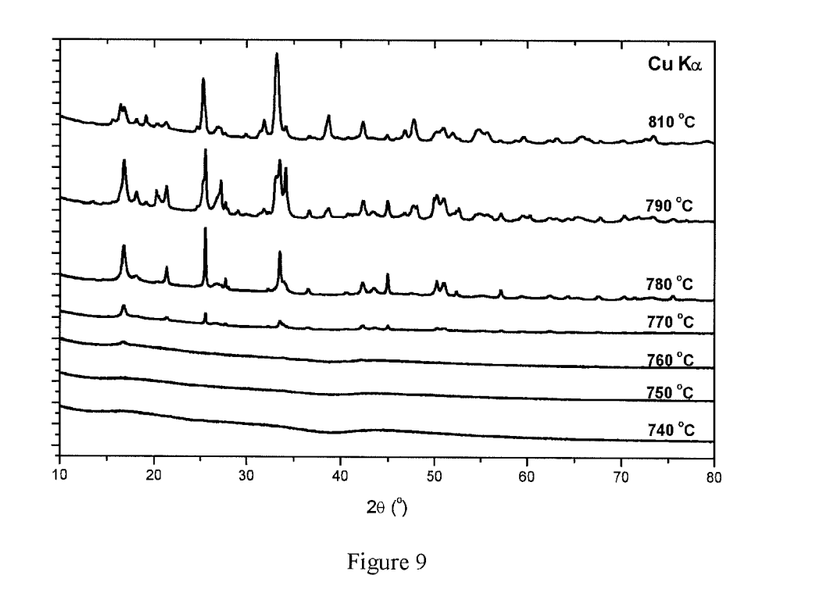
FIG. 9 shows the RX diffractogram of compositions according to one embodiment of the present disclosure compared to the RX diffractogram of a composition obtained at a calcination temperature higher than the crystallization temperature.

FIG. 2 shows the photoluminescence spectrum (triangles) of $YAl_3B_4O_{12}$ obtained as described in Example 1. The powder was pyrolyzed at a pyrolysis temperature of 700° C., the crystallization temperature of the composition being of 760° C. (as shown by the diffraction peaks in the RX diffractograms of FIG. 9). In FIG. 2, a photoluminescence spectrum (rounds) of the same composition $YAl_3B_4O_{12}$ obtained without pyrolyzing the powder is also shown. Both compositions shown in FIG. 2 were obtained by calcinating the powder at a temperature of 740° C.

Figure 3:
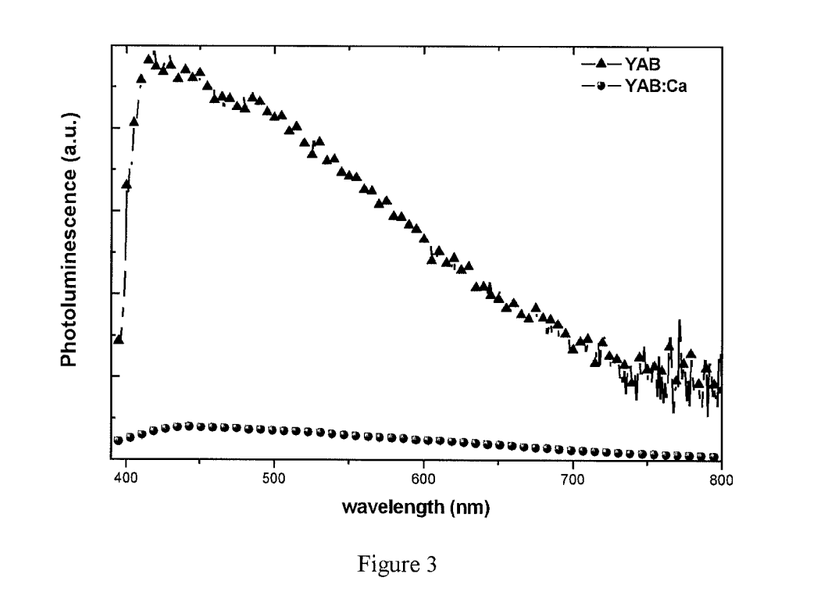
FIG. 3 shows the photoluminescence spectrum of a composition according to one embodiment of the present disclosure compared to the photoluminescence spectrum of a composition containing a divalent cation.
Figure 4:
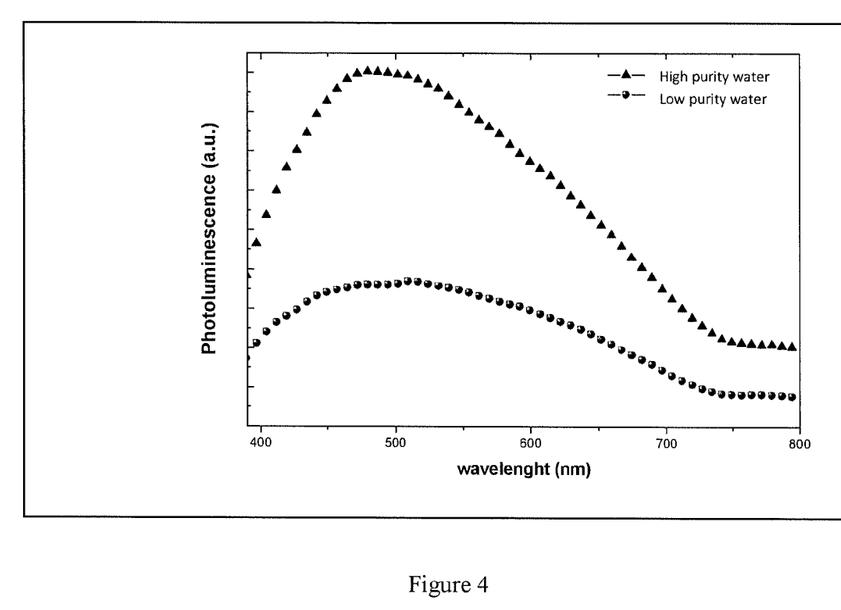
FIG. 4 shows the photoluminescence spectrum of a composition according to one embodiment of the present disclosure compared to the photoluminescence spectrum of a composition obtained starting from precursors solutions not substantially free from monovalent and divalent cations.

FIGS. 3 and 4 show the photoluminescence spectrum (triangles) of $YAl_3B_4O_{12}$ obtained as described in Example 1, the only difference being the purity of water. In particular, the photoluminescence spectrum shown with rounds in FIG. 3 refers to water containing 5000 ppm of Calcium (corresponding to a substitution of 0.5% mol of Y atoms by Ca atoms), while the photoluminescence spectrum shown with rounds in FIG. 4 refers to a case where reverse osmosis water having a conductivity $\rho \approx 89$ μS/cm was used. As described above, the water used in Example 1 contained less than 5 ppm of monovalent and divalent cations and had a conductivity of about 1.1 μS/cm.

In all tests shown in FIGS. 3 and 4, high purity grade reagents, i.e. >99.99%-99,9999%, were used.

Figure 5:
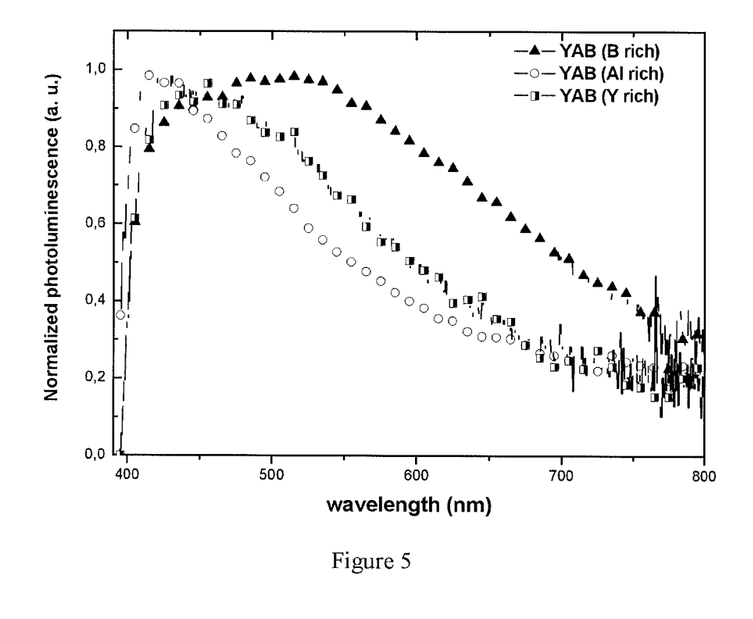
FIGS. 5-7, 10, and 11 show the photoluminescence spectra of compositions according to respective embodiments of the present disclosure.

FIG. 5 shows photoluminescence properties of compositions according to respective embodiments of the present disclosure, all determined as described in Example 1, for a composition of formula $xY_2O_3+yAl_2O_3+zB_2O_3$, at different molar fractions of x, y and z, namely:
triangles: x=0.1, y=0.3, z=0.6;
rounds: x=0.12, y=0.39, z=0.49;
squares: x=0.13, y=0.37, z=0.50.

Figure 6:
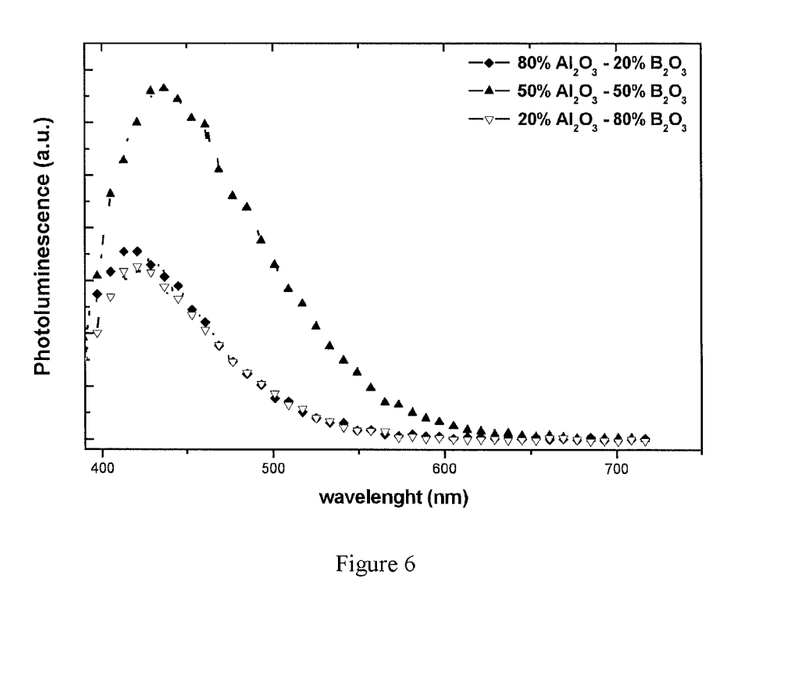

FIG. 6 shows photoluminescence properties of compositions according to respective embodiments of the present disclosure, all determined as described in Example 1, for a composition of formula $xY_2O_3+yAl_2O_3+zB_2O_3$, at different molar fractions of x, y and z, namely:
diamonds: x=0, y=0.8, z=0.2;
black triangles: x=0, y=0.5, z=0.5;
white triangles: x=0, y=0.2, z=0.8.

Figure 7:
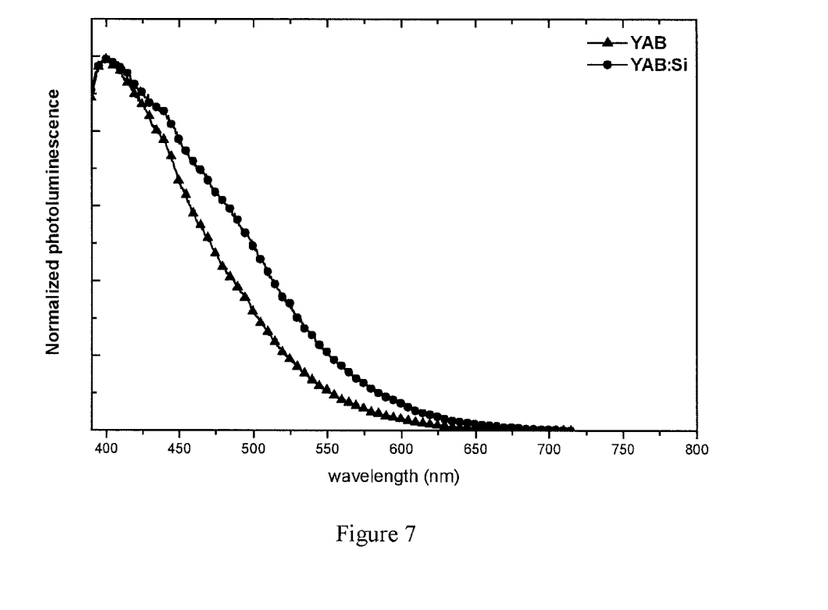

FIG. 7 shows the photoluminescence spectrum of YAB of Example 1 compared with a photoluminescence spectrum of YAB where $B_2O_3$ has been partially substituted by $SiO_2$. In particular, the spectrum designated by triangles corresponds to the unsubstituted $YAl_3B_4O_{12}$ composition of Example 1, while the spectrum designated by rounds corresponds to a composition $YAl_{2.85}Si_{0.15}(BO_3)_4$ obtained according to the method described in Example 1 except for the aluminum, which has been substituted by 5% mol of silicon.

Figure 8:
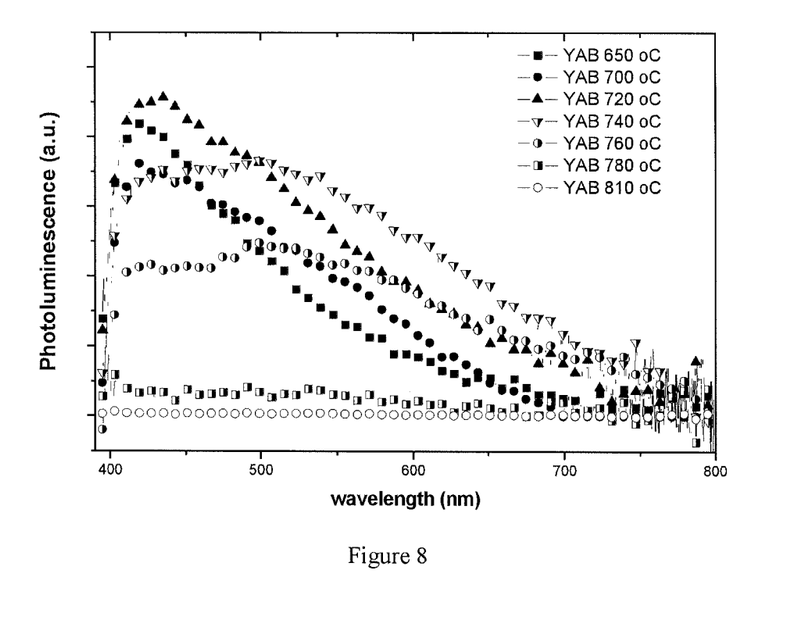
FIG. 8 shows the photoluminescence spectra of compositions according to embodiments of the present disclosure compared to photoluminescence spectra of compositions obtained at calcination temperatures higher than the crystallization temperature.

FIG. 8 shows the photoluminescence spectra of a composition $YAl_3B_4O_{12}$ obtained as described in Example 1, the only difference being the calcination temperature: the pyrolized powder was calcinated at different calcination temperatures. In FIG. 8, photoluminescence spectra of the same composition ($YAl_3B_4O_{12}$) obtained at calcination temperatures lower than the crystallization temperature of the composition are shown, in accordance with respective embodiments of the present disclosure.

Photoluminescence spectra of the same composition ($YAl_3B_4O_{12}$) obtained at calcination temperatures equal to or higher than the crystallization temperature of the composition are also shown in FIG. 8 by way of comparison.

Figure 10:
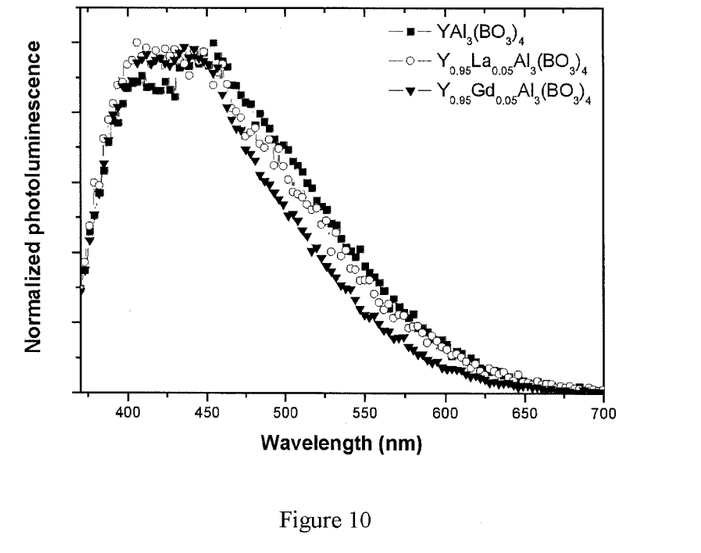

FIG. 10 shows photoluminescence spectra of different compositions according to respective embodiments of the present disclosure, namely of YAB, $Y_{0.95}La_{0.005}Al_3(BO_3)_4$ and $Y_{0.95}Gd_{0.05}Al_3(BO_3)_4$. In the spectrum designated by rounds, the yttrium has been partially substituted by 5% mol of lanthanum, while in the spectrum designated by triangles, the yttrium has been partially substituted by 5% mol of gadolinium. All three compositions were prepared as described in Example 1.

Figure 11:
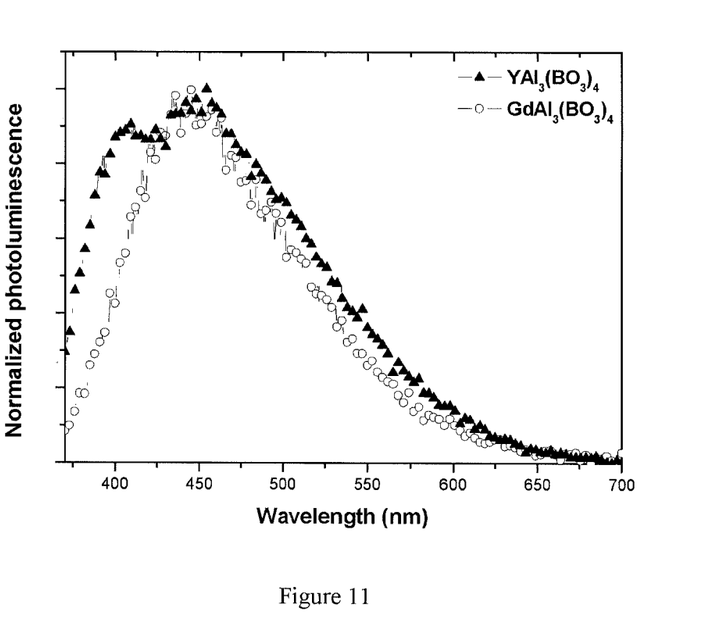

FIG. 11 shows the photoluminescence spectrum of YAB (triangles) compared to the photoluminescence spectrum of $GdAl_3(BO_3)_4$. In the spectrum designated by rounds, the yttrium has been substituted by 100% mol of gadolinium. Both compositions were prepared as described in Example 1.

Quantum yields were measured for YAB powders obtained as described in Example 1, but at different calcination temperatures. The yields were measured in reflexion normal to the luminescent aluminoborate powder with an integrating sphere and using an UV-blue excitation from diodes (385 nm). The results are shown in the following Table 1.

TABLE 1

Quantum yields of YAB samples calcinated at different temperatures

| Calcination temperature (° C.) | Quantum yield (%) (excitation 385 nm) |
| --- | --- |
| 650 | 42 |
| 700 | 38 |
| 720 | 49 |
| 740 | 68 |
| 760 | 39 |
| 780 | 21 |
| 810 | 0 |

Analytical Methods

X-ray powder diffraction patterns were recorded on a D8 Bruker Advance Diffractometer (Cu $K_{\alpha 1}$ radiation, $\lambda=1.54056$ Å) in θ/2θ configuration equipped with a Ge (111) monochromator to follow the amorphous or crystalline quality of aluminoborate powders.

The Photoluminescence (PL) spectra and quantum yields of powdered samples were measured using the reflection method, as described by Wrighton et. al. (*J. Physical Chemistry*, vol. 78 (22) pp. 2229, 1974). This method consist in (1) determining the diffuse reflectance of non-absorbing standard, in the present application Spectralon, at the excitation wavelength, (2) determining the diffuse reflectance of the sample at the same excitation wavelength and (3) measuring the emission of the sample under the same conditions. The powdered sample were set inside a sample holder with a quartz window and coupled to an integrating sphere covered with Spectralon, AvaSphere-50. The luminescence signal was delivered to a spectrometer (AVASpec-1024TEC) by an optical fiber. The integrating sphere and the spectrometer were calibrated with the use of a halogen tungsten lamp (10 W tungsten halogen Avalight-HAL). The excitation source was a high power UV-LED (ThorLabs model M385L2) emitting at continuously at 385 nm and optical power set to 1 mW. The experimental apparatus is described in S. Ivanova et al.; *JOSA B J. Opt. Soc. Am.*, Vol. 26, No. 10, 2009 p. 1930.

The invention claimed is:

1. A luminophore composition comprising amorphous aluminoborate powders, the composition being obtainable by:
preparing an aluminoborate resin by a wet chemical route based on precursors solutions substantially free from monovalent and divalent cations;
drying the resin to obtain a solid;
grinding the solid to obtain a powder;
pyrolyzing the powder at a pyrolysis temperature lower than the crystallization temperature of the composition; and
calcinating the powder so pyrolyzed at a calcination temperature lower than the crystallization temperature of the composition.

2. The composition according to claim 1, wherein the composition has a luminescence band in a range from 350 nm to 750 nm.

3. The composition according to claim 1, wherein the aluminoborate has the following composition:

$xM_2O_3 + yAl_2O_3 + zB_2O_3$ wherein M is at least one trivalent metal, $0 \leq x \leq 0.25$, $0.1 \leq y \leq 0.7$, $0.3 \leq z \leq 0.9$, and $x+y+z=1$,
$B_2O_3$ being optionally partially substituted by a substituent selected from the group comprising: $SiO_2$, $P_2O_5$.

4. The composition according to claim 1, wherein the aluminoborate composition is around the stoichiometric composition of $YAl_3(BO_3)_4$.

5. The composition according to claim 1, wherein the powders have a mean particle diameter ranging from 0.01 μm to 20 μm.

6. The composition according to claim 1, wherein the powders are glass powders having a glass transition temperature $T_g$ from 450° C. to 1000° C.

7. The composition according to claim 3, wherein the at least one trivalent metal is selected from the group consisting of $Y^{3+}$, $Bi^{3+}$, $Sc^{3+}$, $La^{3+}$, $Gd^{3+}$ or a mixture thereof.

8. A process for the preparation of luminophore composition comprising: preparing an aluminoborate resin by means of a wet chemical route based on precursors solutions substantially free from monovalent and divalent cations; drying the resin to obtain a solid; grinding the solid to obtain a powder; pyrolyzing the powder at a pyrolysis temperature lower than the crystallization temperature of the composition; and calcinating the powder so pyrolyzed at a calcination temperature lower than the crystallization temperature of the composition.

9. The process according to claim 8, wherein each of drying, pyrolyzing and calcinating is performed at a heating rate comprised from 10° C./h to 60° C./h.

10. The process according to claim 8, wherein drying is performed under air or inert atmosphere.

11. The process according to claim 8, wherein pyrolyzing is performed under inert atmosphere.

12. The process according to claim 8, wherein pyrolyzing is performed at a temperature from 450° C. to 1000° C.

13. The process according to claim 8, wherein calcinating is performed under oxygen atmosphere.

14. The process according to claim 8, wherein calcinating is performed at a temperature from 450° C. to 850° C.

15. The process according to claim 8, wherein each of the precursors' solutions comprises less than 5000 ppm of monovalent and divalent cations.

16. Use of a composition according to claim 1 to prepare a solid-state UV-visible light converter.

17. A solid-state UV-visible light converter comprising a composition according to claim 1.

18. The converter according to claim 17, wherein the visible light is a white light having a color temperature from 4000 K to 5000 K.

19. A solid-state lighting device, comprising:
an UV emitter; and
a converter according to claim 17.

20. The lighting device according to claim 19, wherein the emitter is an UV-emitting diode (LED).

* * * * *